United States Patent [19]

Kinoshita et al.

[11] Patent Number: 4,914,311
[45] Date of Patent: Apr. 3, 1990

[54] INTEGRATED SEMICONDUCTOR IMAGER CIRCUITS WITH UNIFORM TEMPERATURE DISTRIBUTION

[75] Inventors: Yukio Kinoshita; Tadakuni Narabu; Masahide Hirama, all of Kanagawa, Japan

[73] Assignee: Sony Corporation, Tokyo, Japan

[21] Appl. No.: 147,535

[22] Filed: Jan. 25, 1988

[30] Foreign Application Priority Data

Feb. 23, 1987 [JP] Japan .................................. 62-039776

[51] Int. Cl.$^4$ ...................... H01J 40/14; H01L 29/78; H01L 27/14; H01L 31/00
[52] U.S. Cl. .................................. 250/578.1; 357/24; 357/30
[58] Field of Search ................ 357/24, 30; 250/578; 377/57-63; 358/213.23, 213.25, 213.26, 213.29

[56] References Cited

U.S. PATENT DOCUMENTS 4,280,141  7/1981  McCann et al. ................ 357/24 M
4,709,381 11/1987  Beaudet ......................... 357/24 LR

*Primary Examiner*—Gene M. Munson
*Attorney, Agent, or Firm*—Hill, Van Santen, Steadman & Simpson

[57] ABSTRACT

Disclosed is a semiconductor device, such as a solid-state imager or a delay line, having its body and a peripheral circuit formed on the same chip, in which the peripheral circuit is divided into segments and dispersedly arranged around the body of the device. Such an arrangement reduces influence of dark current on the signal, which has been an outstanding problem encountered in such a semiconductor device.

7 Claims, 1 Drawing Sheet

INTEGRATED SEMICONDUCTOR IMAGER CIRCUITS WITH UNIFORM TEMPERATURE DISTRIBUTION

BACKGROUND OF THE INVENTION

The present invention relates to a semiconductor device such as a solid-state imager and a delay line having imager elements and/or charge transfer elements.

A solid-state imager, for example, of CCD (charge coupled device), CPD (charge priming device), CSD (charge sweep device), and MOS type has an imager body made up of imager elements and a shift register. The imager body is adapted such that signal charges are generated by the imager elements responding to received light according to a picked up optical image and the signal charges are transferred by the shift register to be delivered from an output terminal.

In such a solid-state imager, there is provided a peripheral circuit including such as a drive circuit providing clock signals and the like for driving the solid-state imager body, i.e., the imager elements and the shift register receiving the signal charges therefrom so as to transfer the same, and a signal processing circuit.

Conventionally, such a device, in general, has been formed on separate semiconductor chips, the imager body on one chip and the peripheral circuit on another.

However, with the recent demand for miniaturized and simplified layout of solid-state imagers and for mass producibility of the same, there is a tendency toward incorporating a peripheral circuit such as the drive circuit with the solid-state imager body including the aforesaid imager elements, shift register, and the like, and disposing them on one common semiconductor chip.

In the case of a linear sensor with the aforesaid arrangement wherein the imager elements are linearly disposed, for example, as shown in FIG. 2, a plurality of imager elements 1 are arranged in a line on a semiconductor chip 4 with a pair of shift registers 2 disposed on their both sides, each thereof taking in the signal charges, for example, from every other one of the imager elements 1 corresponding to the light quantities received thereby, for transferring the same, and on the semiconductor chip 4 with the body of the device 3 made up of such imager elements 1 and shift registers 2 disposed thereon, there is also disposed a peripheral circuit 5 including, for example, a timing generator 6, drive circuit 7, and the like. Since, however, the quantity of heat generated by the transistors forming the drive circuit 7 is rather large, it produces problems especially with a linear sensor as shown in the drawing having the imager elements and shift registers distributed over a considerably elongated space. That is, there are produced remarkably large temperature differences between the portion where the drive circuit 7 is disposed and portions spaced apart therefrom, and therefore, considerable unevenness occurs in the thermally generated electric charges, i.e., in the dark currents. The influence of the unevenness in the dark currents is especially serious on such a device as described above treating analog signals, that is, uneven contrast, for example, is produced by the imager of the aforesaid type.

SUMMARY OF THE INVENTION

An object of the present invention is to solve the above mentioned problem of unevenness in the dark currents resulting from the layout on one and the same chip of the semiconductor device, such as a solid-state imager or delay line, with the peripheral circuit incorporated therewith.

The semiconductor device of the present invention comprises imager elements and/or charge transfer elements and their peripheral circuit structured of a plurality of calorific circuit elements such as transistors, which are divided into a plurality of circuit segments so as to be dispersedly arranged around the aforesaid elements. By virtue of the dispersed arrangement of the plurality of calorific circuit elements in the present invention, the heat distribution in the imager elements and/or the charge transfer elements is made uniform and the dark current generated in every portion is made even.

DETAILED DESCRIPTION OF THE PREFERRED EMBODIMENT

In a semiconductor device having imager elements and/or charge transfer elements and a peripheral circuit including a plurality of calorific circuit elements, both thereof being disposed on the same semiconductor chip, the present invention is adapted such that the peripheral circuit is divided, with respect to its circuit arrangement including a plurality of calorific circuit elements, into a plurality of segments and the same are dispersedly arranged around the portion where the body of the device, that is, for example, the imager elements and/or the charge transfer elements, are disposed, and therefore, by suitably designing the locations of and distances between the dispersed elements, a uniform temperature distribution is attained all over the area where the body of the device, i.e., the imager elements and/or the charge transfer elements are disposed. That is, for example, by having the plurality of divided circuit segments distributed more sparsely, or dividing the circuit into the segments such that the numbers of the calorific circuit elements in the circuit segments are decreased, at the circumferential portion of the semiconductor chip where the heat radiation is relatively large, the portion of the body of the semiconductor device subject to the influence of the heat throughout, that is, the imager elements and/or the charge transfer elements in every portion thereof are held in a uniform temperature distribution.

Figure 1:
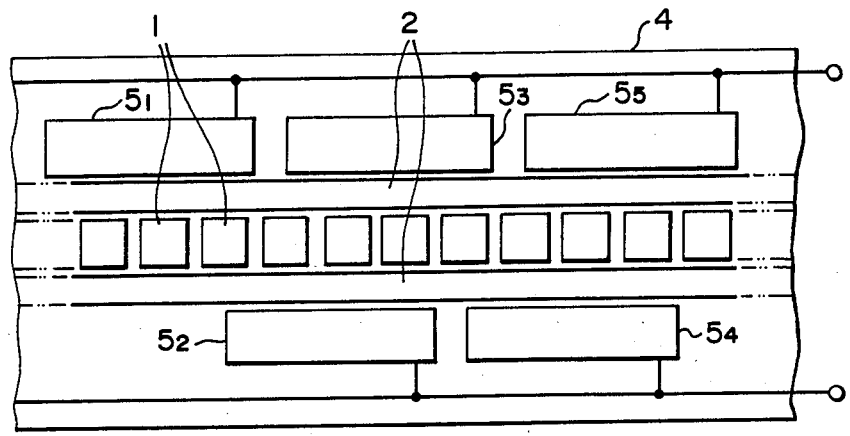
FIG. 1 is an arrangement drawing of the principal portion of an example of a semiconductor device according to the present invention.
Figure 2:
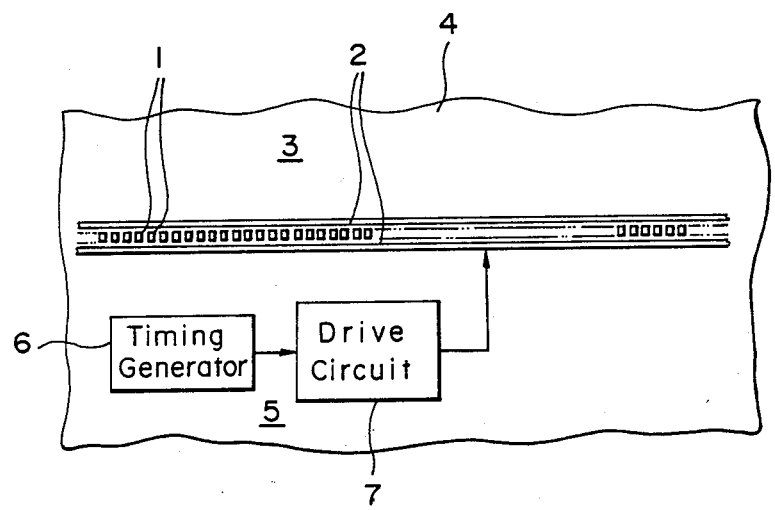
FIG. 2 is an arrangement drawing of a prior art device.

The case where the present invention is applied to a solid-state imager of the linear sensor type will be described below with reference to FIG. 1.

In a known arrangement with a plurality of imager elements 1 disposed in a line on a semiconductor chip 4 and with charge transfer elements, i.e., shift registers 2, disposed on both sides of the same for drawing out signal charges of, for example, every other one of the imager elements generated by their reception of light for transferring the same, circuit elements of the peripheral circuit 5 are disposed on both outer sides of the shift registers 2, that is, a plurality of circuit elements, especially those of the drive circuit which are highly calorific, or more particularly, those structured of transistors, are made into an organization of a plurality of segments $5_1$, $5_2$, $5_3$, . . . , and pluralities thereof are disposed along the shift registers 2 on both sides of the linear sensor or the imager portion 1 at required spaces apart.

Although the example shown in the drawing is the case where the present invention is applied to a linear sensor, it can also be applied to an area sensor in which the imager elements are arranged two-dimensionally and it is applicable not only to a solid-state imager but also to a delay line of CCD structure or of MOS structure.

As described so far, the present invention is applied to a solid-state imager or a delay line having at least either of imager elements and charge transfer elements handling analog signal charges so that the peripheral circuit of the aforesaid elements may be disposed on the same semiconductor chip; nevertheless, uniform temperature distribution in every portion can be attained. Therefore, the difficulty of unevenness in contrast or signal level on account of irregularities in dark currents resulting from thermally generated electric charges can be overcome.

What is claimed is:

1. A linear sensor formed on a semiconductor chip, comprising:
   imager means for converting received light into signal charges;
   charge transfer means disposed on two opposite sides of said imager means for transferring said signal charges; and
   a plurality of calorific circuit elements composing a timing generator and plural drive circuits for said charge transfer means, said calorific circuit elements being divided into plural segments and arranged dispersedly around said imager means and said charge transfer means, in order to provide uniform temperature distribution of said imager means and said charge transfer means.

2. A semiconductor device according to claim 1, wherein said imager means and said charge transfer means are constructed of charge coupled devices.

3. A semiconductor device according to claim 1, wherein said imager means is constructed of photodiodes and switch elements and said charge transfer means is structured of charge coupled devices.

4. A semiconductor device according to claim 1, wherein said plurality of calorific circuit elements include a drive circuit for said charge transfer means.

5. A semiconductor device according to claim 1, wherein said plurality of calorific circuit elements include a signal processing circuit of signal charges.

6. A semiconductor device according to claim 1, wherein said charge transfer means is a delay line constructed of charge coupled devices.

7. A semiconductor device according to claim 1, wherein dark currents generated in said semiconductor chip at work is substantially uniform throughout said chip.

* * * * *